United States Patent [19]

Felber

[11] Patent Number: 5,263,631
[45] Date of Patent: Nov. 23, 1993

[54] CONTACT-MAKING SYSTEM FOR SEMICONDUCTOR WIRE CONNECTIONS

[75] Inventor: Armin Felber, Luzern, Switzerland

[73] Assignee: Esec SA

[21] Appl. No.: 33,651

[22] Filed: Mar. 16, 1993

[30] Foreign Application Priority Data

Mar. 26, 1992 [CH] Switzerland .................. 00969/92

[51] Int. Cl.⁵ ............................................. H01L 21/60
[52] U.S. Cl. ................................. 228/4.5; 228/10; 228/102; 219/56.21
[58] Field of Search .................. 228/4.5, 8, 10, 102, 228/103; 219/56.21, 56.22, 113

[56] References Cited

FOREIGN PATENT DOCUMENTS 0133118 2/1985 European Pat. Off. .

OTHER PUBLICATIONS

Patent Abstracts of Japan, vol. 5, No. 149, [E075], Sep. 19, 1981.
Patent Abstracts of Japan, vol. 6, No. 189, [E133], Sep. 29, 1982.
Patent Abstracts of Japan, vol. 8, No. 231, [E274], Oct. 24, 1984.
Patent Abstracts of Japan, vol. 12, No. 395, [E671], Oct. 20, 1988.

*Primary Examiner*—Samuel M. Heinrich
*Attorney, Agent, or Firm*—Egli International

[57] ABSTRACT

A contact-making system for wire connections on electronic components in semiconductor connection technology, which includes a contact-making device having a capillary tube arranged thereon for guiding a bonding wire, and at least one electrode, which is allocated to the head piece of the capillary tube, for producing a spark transfer, by which spark transfer a bonding-wire endpiece which projects from the head piece is melted to form a bonding-wire sphere, the bonding-wire sphere being uniformly shaped and arranged concentrically with respect to the bonding wire or with respect to the bonding-wire endpiece by providing at least two or more electrodes which are distributed uniformly on the circumference with respect to the head piece or to the bonding-wire endpiece and are in each case effectively connected to an independent power unit, which is constructed as a current source, it being possible to activate the power units from a single control unit.

8 Claims, 2 Drawing Sheets

CONTACT-MAKING SYSTEM FOR SEMICONDUCTOR WIRE CONNECTIONS

BACKGROUND OF THE INVENTION

The invention relates to a contact-making system for wire connections on electronic components in semiconductor connection technology, consisting of a contact-making device having a capillary tube arranged thereon for guiding a bonding wire, and having an electrode, which is allocated in a stationary manner or such that it can pivot into a head piece of the capillary tube, for producing a spark transfer, which is directed onto a bonding-wire endpiece which projects from the head piece, for melting the bonding-wire endpiece to form a bonding-wire sphere which can be welded to the respective component by pressure.

For the wire connection, which makes contact by means of ultrasound, of circuits to electronic components, a device is known (U.S. Pat. No. 4,586,642) in which, by means of a contact-making device which is supported such that it can pivot about an axis and is constructed as an energy transducer, a bonding wire which is guided through a capillary tube and is guided out of the capillary tube by means of an endpiece is melted by sparks and in this case is formed into a bonding-wire sphere, for example the bonding-wire sphere, which corresponds to approximately 2.5 times the wire diameter, being pressed onto a connecting surface (pad) of a semiconductor component (semiconductor device) which is known per se, and being welded (bonded).

In order to produce electrical sparks for forming the bonding-wire sphere, it is known for either an electrode which can be pivoted with respect to the capillary tube or a stationary electrode to be allocated to the head piece of the capillary tube. The wire end, which is guided centrally through the capillary tube and projects from the head piece, is melted to form a sphere by means of a spark transfer which is produced between the electrode and the wire.

In the case of the electrode which can be pivoted in, the spark is directed essentially from underneath onto the bonding-wire endpiece, this method on the one hand being dependent on an increased time requirement for the pivoting-in process and on the other hand the necessary mechanical means being subject to undesirable wear, taking into account the highly-dynamic movement sequences, and the exact formation of the bonding-wire sphere thus no longer being ensured after a relatively short operating time.

In the case of the stationary electrode, the spark is directed laterally onto the bonding-wire end-piece, this method leading to the bonding-wire sphere being formed on the bonding-wire endpiece eccentrically with respect to the symmetry axis of the bonding wire which is guided in the capillary tube, as a result of the force of the spark acting on the wire end, and it hence not being possible to maintain the required bonding accuracy.

SUMMARY OF THE INVENTION

The invention is based on the object of improving the spark transfer which is necessary for fusing the bonding-wire sphere on and is directed onto the wire end, to the effect that the thus fused-on bonding-wire sphere is formed uniformly and is arranged centrally with respect to the bonding wire which is guided in the capillary tube.

This object is achieved according to the invention in that at least two electrodes, which are arranged diametrically opposite one another and distributed uniformly on the circumference with respect to the head piece, are allocated to the bonding-wire endpiece which projects from the head piece or to the bonding-wire sphere which is to be formed, and in that each electrode is effectively connected to a power unit, which can be activated by a single control unit, for temporally synchronous driving.

Further features of the invention result from the following description, in conjunction with the drawing and the individual patent claims.

BRIEF DESCRIPTION OF THE DRAWINGS

The invention is described below with reference to the drawing, in which.

DETAILED DESCRIPTION OF THE PREFERRED EMBODIMENT

Figure 1:
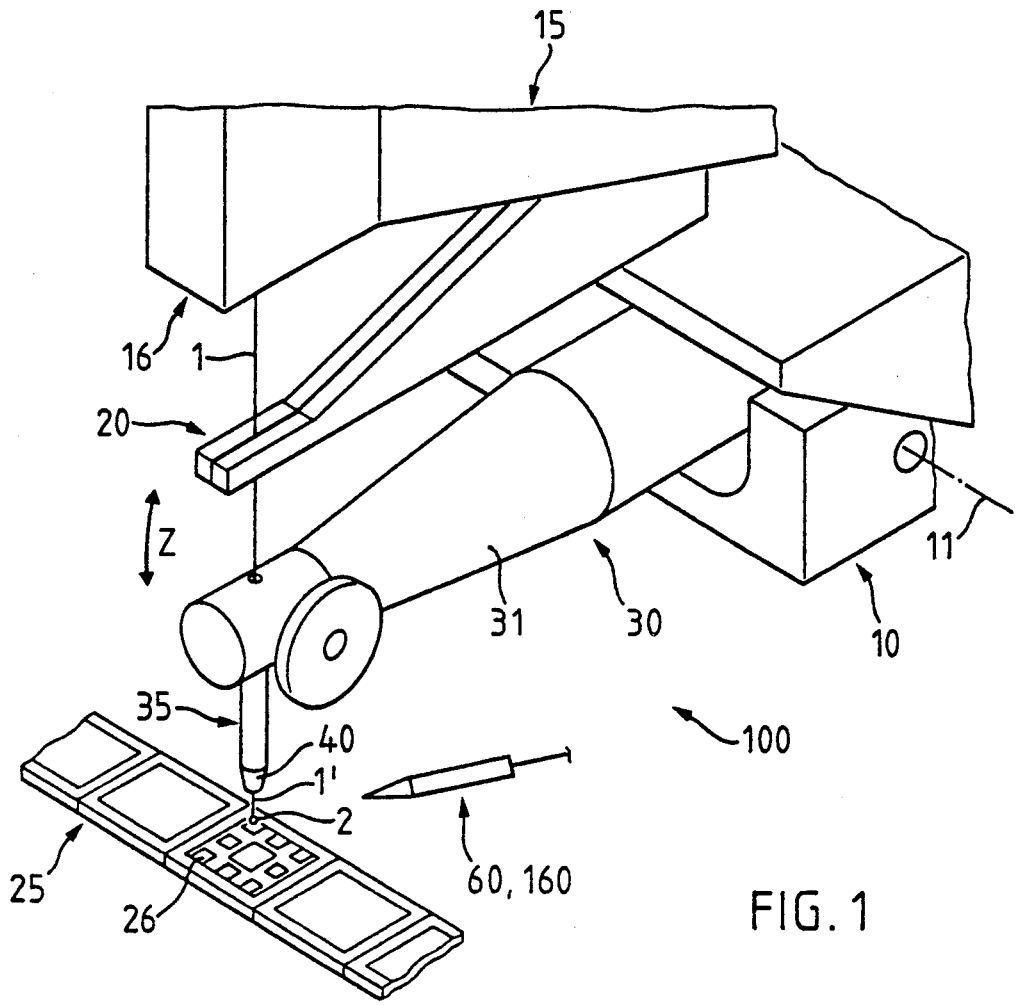
FIG. 1 shows a perspective side view of a device, which is represented as a system overview, for semiconductor connection technology.

In order to explain the invention, FIG. 1 shows in a perspective side view and as a general system overview, a device which in its totality is designated by 100, for semiconductor connection technology.

The device 100 essentially comprises a partially represented supporting element 10, a cantilever arm 15 with an optical scanning element 16 arranged thereon, a clamping device 20, and an energy transducer 30 which is provided with a horn 31 and a capillary tube 35 arranged thereon. The energy transducer 30, which is constructed as a contact-making device, is effectively connected to a drive, which is not shown, and is supported in a manner known per se in the supporting element 10, which is constructed as a housing that to some extent can oscillate (or swing) about a horizontal axis 11 in the arrow direction Z).

The device 100, which essentially comprises the elements 10, 15, 20, 30 and an electrode arrangement which in its totality is designated by 60 or 160, forms an intrinsically closed functional unit which is constructed for the highly dynamic and precise delivery movement of the energy transducer 30, with the horn 31 and the capillary tube 35 arranged thereon, to a chip (semiconductor component) which is represented schematically and is designated in its totality by 25.

A bonding wire 1 is supplied from a wire coil which is not shown to the clamping device 20, which bonding wire 1 is guided from there centrally into the capillary tube 35 and penetrates a head piece 40 of the capillary tube 35 in such a manner that a bonding-wire endpiece 1' is arranged on the end 40' (FIG. 2) of the head piece 40. The bonding-wire endpiece 1, is melted in a manner known per se by means of corresponding spark formation to form a bonding-wire sphere 2 and is pressed, essentially by means of the capillary tube, onto the chip 25, which is provided with corresponding connecting surfaces 26 (pad), and is welded (bonded).

Figure 2:
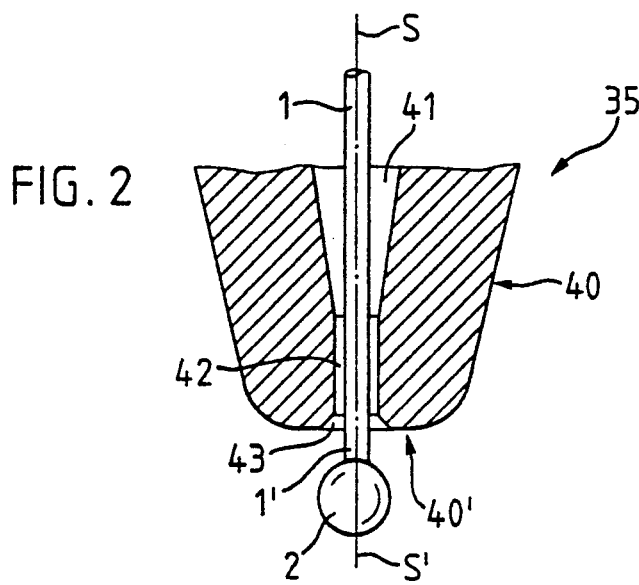
FIG. 2 shows a subelement, which is represented on a larger scale and in a sectional view, on a capillary tube for the contact-making device.

FIG. 2 shows the head piece 40 of the capillary tube 35 on a larger scale and in sectional view. The head piece 40 is penetrated in the direction of the bushing of the bonding wire 1 by a first, conically constructed hole 41 and by a second, cylindrically constructed hole 42, which is connected to said first hole 41, the hole 42 being constructed on the end 40' of the head piece 40 as a conically outwardly extending recess 43. FIG. 2 furthermore shows the bonding wire 1, which is arranged centrally in the head piece 40, with the fused-on bonding-wire sphere 2.

Figure 3:
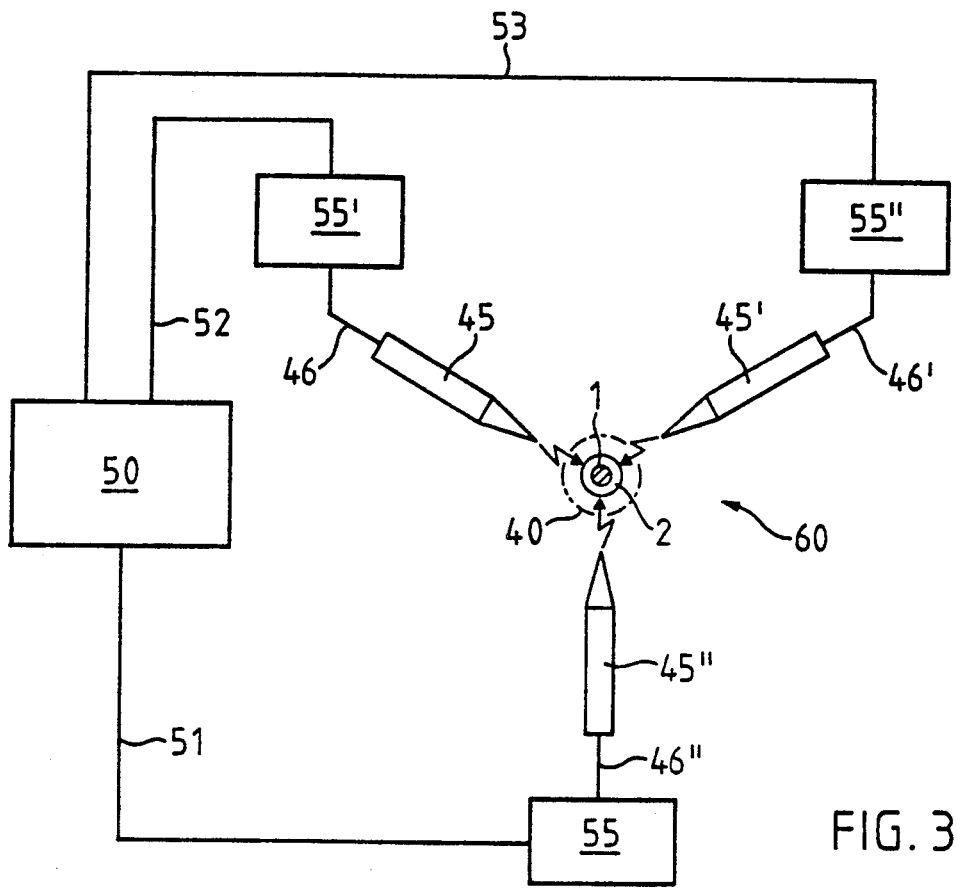
FIG. 3 shows a first variant, which is represented schematically and in plan view, of an electrode arrangement, which is allocated to the capillary tube of the contact-making device, having a circuit, which is represented as a block diagram, for the electrodes.

FIG. 3 shows a first variant, which is represented in plan view and as a block diagram, of an electrode arrangement 60, and the electrodes 45, 45', 45", which are correspondingly allocated to the head piece 40 of the capillary tube 35 in order to form the bonding-wire sphere 2 (FIG. 2), can be seen. In order to produce the electrical energy, the electrodes 45, 45', 45" are connected via corresponding leads 46, 46', 46" to in each case one associated power unit 55, 55', 55". The power units 55, 55', 55" are connected to a control unit 50 via electrical leads 51, 52, 53.

Figure 4:
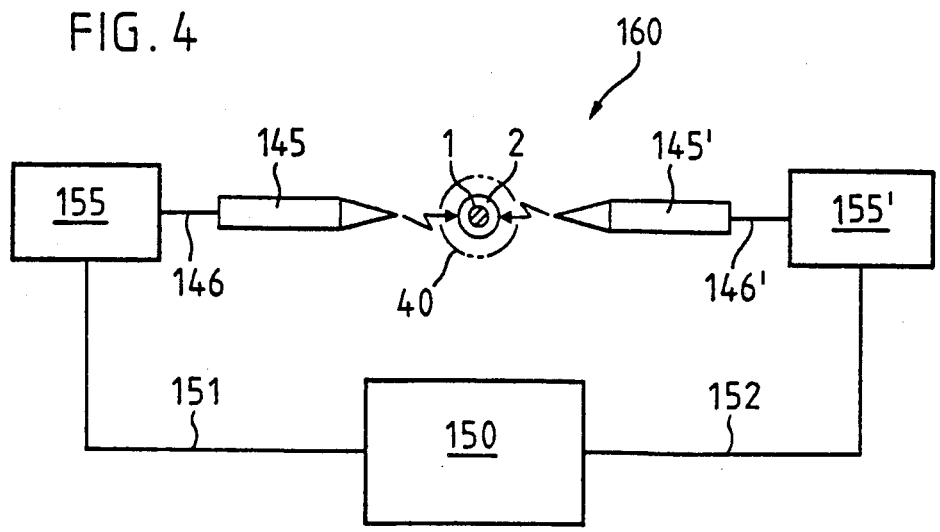
FIG. 4 shows a second variant of the electrode arrangement, having a circuit which is correspondingly represented as a block diagram.

FIG. 4 shows a second variant of an electrode arrangement 160, and the electrodes 145 and 145', which are correspondingly allocated to the head piece 40 of the capillary tube 35 in order to form the bonding-wire sphere 2, can be seen. In order to produce the electrical energy, the two electrodes 145 and 145' are connected via corresponding leads 146 and 146' to in each case one associated power unit 155 and 155'. The power units 155 and 155, are connected via electrical leads 151 and 152 to a control unit 150.

The electrodes 45, 45', 45" according to FIG. 3, and the electrodes 145 and 145, according to FIG. 4 are preferably driven in a temporally synchronous manner by power units 55, 55', 55", or 155, 155' respectively, which are functionally separated and are constructed as current sources. This ensures that each individual electrode 45, 45', 45" or 145, 145' produces an independent, controllable spark.

The spark voltage which is in each case directed from the electrodes 45, 45', 45", or 145, 145' to the bonding-wire endpiece 1' is dependent on the distance between the respective electrode and the bonding wire, the spark voltage rising linearly with the distance. This effect can be used, for example, for monitoring the concentricity of the electrode arrangement and/or for controlling the size of the sphere which is to be fused on.

During monitoring of the spark voltage, information on the distance between the individual electrode and the bonding wire is determined, so that in the event of the spark voltage of the individual electrodes being of equal magnitude, the bonding wire is arranged concentrically with respect to the electrodes, and in the event of a different spark voltage, the bonding wire is arranged eccentrically with respect to the electrodes. If an eccentric arrangement of the bonding wire with respect to the electrodes is confirmed, corresponding measures for correction of the spherical symmetry must be implemented.

In order to set and correct the spherical symmetry, the electrical current can be reset, which can be done, for example, via the individual power unit 55, 55', 55" or 155, 155' respectively, or via the control unit 50 or 150 respectively, or, however, a relative displacement of the electrodes with respect to one another can be carried out using mechanical means (not shown).

However, it is also possible for a predetermined value of the electrical voltage to be compared with the instantaneous value, the comparison preferably being carried out permanently, and a value derived therefrom being used to achieve symmetrical bonding-wire spheres.

While the spark voltages are being directed onto the bonding-wire endpiece 1', a bonding-wire sphere 2 (FIG. 2), whose diameter is dependent on the bonding-wire diameter, is fused on in a manner known per se. In this case, the bonding-wire sphere 2 is melted back (not shown) into the head piece 40 of the capillary tube 35 in such a manner that the distance between the electrodes and the sphere is increased, and the spark voltage hence correspondingly rises. On reaching the predetermined electrical voltage value, the functional unit of the electrode arrangement 60 or 160 respectively is cut off, in order to achieve a defined bonding-wire melted-back length.

At this point, it should be mentioned that two or three electrodes or even, in a manner not shown in more detail, a plurality of electrodes can be allocated to the head piece 40 of the capillary tube 35, as represented in FIG. 3 and FIG. 4. In this case, the electrodes are distributed uniformly on the circumference with respect to the head piece 40 or with respect to the projecting bonding-wire endpiece 1' (FIGS. 1, 2). In this case, the electrodes are attached, in a fixed manner with respect to the individual electrodes, to a correspondingly constructed retaining device which is not shown.

As a result of the symmetrical arrangement of the individual electrodes with respect to the bonding-wire endpiece 1' projecting from the head piece 40, and the temporally synchronous driving of the electrodes, on the one hand a spark transfer is achieved which can easily be monitored and on the other hand uniform shaping of the bonding-wire sphere 2 is achieved. The symmetry axis S of the bonding wire 1, and the symmetry axis S' of the bonding-wire sphere 2 are identical to one another.

I claim:

1. A contact-making system for wire connections on electronic components in semiconductor connection technology, comprising:

a contact making device having a capillary tube arranged so as to guide a bonding wire;

electrode means including at least two electrodes for producing a spark transfer which is directed to an endpiece of the bonding wire that projects from a headpiece of the capillary tube, so that the bonding wire endpiece is melted to form a bonding wire sphere that is weldable by pressure to a respective electronic component, said electrodes being uniformly distributed around the headpiece;

power supply means including a separate power unit connected to each electrode so as to power the electrode; and a single control unit activating the power units to temporally and synchronously drive the electrodes.

2. A system according to claim 1, wherein the electrode means includes a plurality of electrodes allocated to the bonding-wire endpiece and uniformly distributed circumferentially with respect to the head piece.

3. A system according to claim 2, wherein the power units are electrical current sources.

4. A system according to claim 3, wherein a spark voltage that is directed from the respective electrode onto the bonding-wire endpiece is used for one of monitoring concentricity of the electrode arrangement and achieving symmetrical bonding-wire spheres, one of the control unit and the separate power unit being provided with means for setting electrical current for correction of spherical symmetry.

5. A system according to claim 4, and further comprising mechanical means for adjusting relative to one another to correct spark voltage.

6. A system according to claim 4, wherein one of the individual power unit and the control unit (50 or 150) is provided with means for permanent comparison of a predetermined electrical voltage value with an instantaneous value of electrical voltage.

7. A system according to claim 4, wherein the individual power unit is constructed with an associated electrode in each case as a functional unit and is provided with means for switching off the functional unit upon reaching a predetermined electrical voltage value.

8. A system according to claim 1, wherein two electrodes are provided that are arranged around the headpiece diametrically opposite one another.

* * * * *